United States Patent
Rouvroy et al.

(10) Patent No.: US 10,334,246 B2
(45) Date of Patent: Jun. 25, 2019

(54) METHOD AND DEVICE FOR COMPRESSION AND DECOMPRESSION OF BINARY DATA

(71) Applicant: intoPIX s.a., Mont-Saint-Guibert (BE)

(72) Inventors: Gael Rouvroy, Woluwe-Saint-Pierre (BE); Thomas Denison, Gembloux (BE); Tanguy Gilmont, Court-Saint-Etienne (BE)

(73) Assignee: intoPIX s.a., Mont-Saint-Guibert (BE)

( * ) Notice: Subject to any disclaimer, the term of this patent is extended or adjusted under 35 U.S.C. 154(b) by 151 days.

(21) Appl. No.: 15/414,831

(22) Filed: Jan. 25, 2017

(65) Prior Publication Data
US 2017/0223354 A1 Aug. 3, 2017

(30) Foreign Application Priority Data
Jan. 28, 2016 (EP) .................... 16153212

(51) Int. Cl.
*H04N 19/124* (2014.01)
*H04N 19/126* (2014.01)
(Continued)

(52) U.S. Cl.
CPC ........ *H04N 19/124* (2014.11); *H03M 7/3059* (2013.01); *H03M 7/3071* (2013.01);
(Continued)

(58) Field of Classification Search
CPC ... H04N 19/124; H04N 19/126; H04N 19/146
See application file for complete search history.

(56) References Cited

U.S. PATENT DOCUMENTS

| 5,970,172 A * | 10/1999 | Mochizuki | H04N 19/63 375/E7.04 |
| 6,339,614 B1 * | 1/2002 | Gupta | H04N 19/61 375/240.01 |

(Continued)

FOREIGN PATENT DOCUMENTS

EP 1750447 A2 2/2007

OTHER PUBLICATIONS

European Search Report and Opinion for European Application No. 16153212.

*Primary Examiner* — Robert J Hance
(74) *Attorney, Agent, or Firm* — Christopher Casieri

(57) ABSTRACT

The invention relates to a method for compressing a set of input binary data values x, all coded in a same number B of bits, into a corresponding set of output data values x', all coded in a smaller number b of bits, obtainable by
(i) computing a quantization step size dq $$dq = \frac{2^{B+1}}{2^{b+1}-1}$$

(ii) dividing the range of values $[0, 2^B-1[$, into $2^b$ subranges, the first subrange being $[0, INT(dq/2)[$
the $i^{th}$ subrange being $[INT((i-3/2)*dq)+1, INT((i-1/2)*dq)[$, for i going from 2 to $2^b$
The invention also relates to a method for decompressing data and to applications of said method for compressing/decompressing video data, and to devices for performing these operations.

16 Claims, 5 Drawing Sheets

(51) Int. Cl.
*H04N 19/146* (2014.01)
*H04N 19/184* (2014.01)
*H04N 19/91* (2014.01)
*H03M 7/30* (2006.01)
*H04N 19/136* (2014.01)

(52) U.S. Cl.
CPC ......... *H04N 19/126* (2014.11); *H04N 19/146* (2014.11); *H04N 19/184* (2014.11); *H04N 19/91* (2014.11); *H04N 19/136* (2014.11)

(56) References Cited

U.S. PATENT DOCUMENTS

| | | | |
|---|---|---|---|
| 2002/0110193 A1* | 8/2002 | Yoo | H04N 19/70 375/240.02 |
| 2008/0031337 A1* | 2/2008 | Hasegawa | H04N 19/176 375/240.16 |
| 2016/0057418 A1* | 2/2016 | Lei | H04N 19/124 375/240.03 |
| 2016/0198160 A1* | 7/2016 | Wang | H04N 19/126 375/240.03 |

* cited by examiner

| | sign | 1 | 0 | 0 | 0 | 1 | 1 | 1 | 1 | 0 | 0 | 0 | 1 | 0 | 0 | 0 | 0 |
|---|---|---|---|---|---|---|---|---|---|---|---|---|---|---|---|---|---|
| bits | 14 | | | | | | | | | | | | | | | | |
| | 13 | | | | | | | | | | | | | | | | |
| | 12 | | | | | | | | | | | | | | | | |
| | 11 | | | | | | | | | | | | | | | | |
| | 10 | | | | | | | | | | | | | | | | |
| | 9 | | | | | | | | | | | | | | | | |
| | 8 | | | | | | | | | | | | | | | | |
| | 7 | | | | | | 0 | 1 | 0 | 1 | | | | | | | |
| | 6 | | | | | | 1 | 1 | 1 | 0 | | | | | 0 | 1 | 1 | 0 |
| | 5 | | | | | | 1 | 0 | 1 | 0 | 1 | 1 | 0 | 0 | 1 | 0 | 1 | 1 |
| | 4 | | | | | | 1 | 1 | 0 | 1 | 1 | 1 | 1 | 1 | 1 | 0 | 0 | 1 |
| | 3 | | 0 | 1 | 0 | 0 | 0 | 0 | 1 | 0 | 1 | 1 | 1 | 1 | 1 | 0 | 0 | 1 |
| | 2 | | 1 | 1 | 0 | 1 | 0 | 0 | 0 | 0 | 1 | 0 | 1 | 1 | 0 | 1 | 1 | 1 |
| | 1 | | 0 | 0 | 0 | 1 | 0 | 0 | 0 | 1 | 1 | 0 | 0 | 0 | 0 | 1 | 0 | 1 |
| | 0 | | 1 | 0 | 0 | 1 | 0 | 0 | 1 | 1 | 1 | 0 | 1 | 0 | 1 | 1 | 0 | 1 |
| GCLI | | | 4 | | | | 8 | | | | 6 | | | | 7 | | | |
| GTLI | | | | | | | | | | 4 | | | | | | | | |
| y | | 5 | 12 | 0 | 7 | 112 | 208 | 105 | 147 | 63 | 56 | 29 | 28 | 57 | 71 | 100 | 63 |
| B | | 4 | 4 | 4 | 4 | 8 | 8 | 8 | 8 | 6 | 6 | 6 | 6 | 7 | 7 | 7 | 7 |
| b | | 0 | 0 | 0 | 0 | 4 | 4 | 4 | 4 | 2 | 2 | 2 | 2 | 3 | 3 | 3 | 3 |
| dq | | 0 | 0 | 0 | 0 | 17 | 17 | 17 | 17 | 18 | 18 | 18 | 18 | 17 | 17 | 17 | 17 |
| y' | | 0 | 0 | 0 | 0 | 7 | 13 | 6 | 9 | 3 | 3 | 2 | 2 | 3 | 4 | 6 | 4 |
| y'' | | 0 | 0 | 0 | 0 | 115 | 214 | 99 | 148 | 54 | 54 | 36 | 36 | 51 | 68 | 102 | 68 |
| ε | | 5 | 12 | 0 | 7 | -3 | -6 | 6 | -1 | 9 | 2 | -7 | -8 | 6 | 3 | -2 | -5 |

METHOD AND DEVICE FOR COMPRESSION AND DECOMPRESSION OF BINARY DATA

FIELD OF THE INVENTION

The invention relates to a method and device for compression and decompression of binary data and to a method for storing/retrieving or transmitting/receiving images or video data streams using said method for compression and decompression.

DESCRIPTION OF PRIOR ART

The audio-visual market is rapidly evolving to ultra-high resolutions (8192×4320 pixels) and higher frame rates. Real-time hardware systems therefore need to process data at higher and higher pixel rates. There is a need to limit the storage capacity required for storing video images and/or channel bandwidth for transmitting video images. To address this problem, a known solution is reducing the number of bits used for coding a binary value. Reducing the number of bits of a value encoded on B bits to a value coded on b bits with B>b, is an operation called quantization.

A known method to quantize numerical values is described below. Other methods exist that are adapted to particular value characteristics, for example to quantize logarithmic or exponential values. Here we will describe the general case. If $[0, N_{max}[$ is the interval boundaries of any value to quantize, and dq the quantization step size (the gap between two successive values of the quantized set), a value x is quantized into a value x' as follows:

$$x \to x' = \left\lfloor \frac{x}{dq} + \frac{1}{2} \right\rfloor$$

where the $\lfloor \; \rfloor$ operator stands for "rounding to the lowest integer". The interval is partitioned into (Nmax/dq)+1 sub-ranges, each of which corresponding to a quantized value. The ½ term centres the subranges correctly on their respective sub-interval. A quantized value x' is dequantized into a value x" as follows:

$$x' \to x'' = \lfloor x' \cdot dq \rfloor$$

FIG. 1 represents the values of x on the horizontal axis, the values of x being integers between zero and 127, i.e. $N_{max}=128$. The quantization step size, i.e. the gap between two successive values of the quantized set, dq is equal to 16. The interval $[0, 128[$ is partitioned into 9 subranges. The plain line represents the dequantized values x". The dashed line represents the original, unquantized values. The values of x from 0 to 7 correspond to dequantized value 0. The values of x from 8 to 23 correspond to dequantized value 16, etc., up to the values of x from 120 to 127 corresponding to dequantized value 128. When values are signed, the principle remains the same. Values to quantize being within the $]-Nmax, Nmax[$ interval, the sign $x_s$ is separated from the absolute value y and one proceeds as above:

$$y = |x|$$

$$x_s = \text{sign}(x)$$

$$y' = \left\lfloor \frac{y}{dq} + \frac{1}{2} \right\rfloor$$

FIG. 2 represents the corresponding relation between x and x". The inverse quantization reconstructs the value x" in the original domain. Since some amount of precision has been lost, the resulting values are different and the difference is called the truncation error ε (gap between the plain and the dashed line)

$$x'' = x_s \cdot y' \cdot dq$$

$$\varepsilon = x'' - x$$

In the case where the input and output data are binary values, the situation is as follows: To encode an integer value x on 8+1 bits, one bit is used to indicate the sign (e.g. 0 for positive, 1 for negative), and B bits to represent the absolute value of x. Similarly, b bits are used to encode the quantized absolute value y' and one bit $x_s$ to indicate its sign:

$$N_{max} = 2^B \quad (1)$$

$$dq = \frac{N_{max}}{2^b} = 2^{B-b}$$

$$y = |x|$$

$$x_s = \text{sign}(x)$$

$$y' = \left\lfloor \frac{|x|}{2^{B-b}} + \frac{1}{2} \right\rfloor = \left\lfloor |x| \gg (B-b) + \frac{1}{2} \right\rfloor$$

where the «and» operators stand for left and right binary shift, respectively. Binary shifts to the right keep the resulting bits to the right of $2^0$-weight bit, i.e. fractional values may be obtained. The quantized value is obtained with a simple binary right-shift of B-b bits of the original value followed by a rounding to the nearest integer.

The "½" term in equation (1) requires one extra bit to code the quantized value and instead of removing B-b bits the quantization only removes B-b-1 bits. One can see on FIG. 1 that we have 9 subranges corresponding to 9 values of y' ranging from 0 to 8, and requiring four bits for coding the quantized values. In FIG. 2, we have 17 subranges corresponding to 17 values for y', ranging from −8 to +8, requiring five bits for coding, depending on the value of x. This is not desirable since a property sought in compression is the ability to determine precisely how many bits will be required to code the quantized values before transmitting or storing them. This required extra bit has an impact when the level of quantization (how many bits are removed) is chosen in function of the target output rate (how many bits are output). Since adjacent values are often correlated and contained in the same range, compression algorithms take advantage of this feature to regroup them in blocks that are encoded with the same numbers of bits. This number is set by the highest absolute value, assuming those values are centred on zero. A unique quantization step size dq is used for each block, reducing the amount of information added to the compressed code stream for the inverse quantization procedure, which needs to retrieve the dq quantization step size in order to restore the quantized values. Therefore any change in the number of output bits after the selection of this quantization step size will produce an incorrect rate, or require an iterative process to keep the rate under control.

For example, if b<digits> is the binary notation of a value, and if we consider a block of four 4-bit values, $$x = \begin{pmatrix} 2 \\ 7 \\ 0 \\ 5 \end{pmatrix} = \begin{pmatrix} b0010 \\ b0111 \\ b0000 \\ b0101 \end{pmatrix}$$

This particular x block needs 3 bits to encode each of its values. If the algorithm decides this block should have the values coded on 2 bits in the output stream (usually decided on a quality vs cost criterion), we get:

$$B = 3, b = 2 \Rightarrow dq = 2$$

$$y'_i = \left\lfloor \frac{x_i}{4} + \frac{1}{2} \right\rfloor = \begin{pmatrix} b01 \\ b100 \\ b00 \\ b11 \end{pmatrix}$$

We see that $x_2=7$ yields a quantized value $y'_2=4$ on 3 bits, because of the nearest-integer rounding. This is a problem because the earlier decision was to output 2 bits for each value of this block, thus 8 bits in total and not 9 bits.

Fixed Width Quantization (Method 1)

According to a known method having fixed width quantization (method 1), one can avoid this and keep the number of bits constant. This is done by omitting the ½ term in the quantization:

$$y = |x|, y' = \left\lfloor \frac{|x|}{2^{B-b}} \right\rfloor = \lfloor |x| \gg (B-b) \rfloor$$

The corresponding inverse quantization introduces a corrective term to compensate the bias due to the simplification in the forward quantization:

$$y'' = \left(y' + \frac{1}{2}\right) \cdot 2^{B-b} = (2y' + 1) \ll (B - b - 1)$$
$$x'' = x_s \cdot y''$$

This is a simple binary left-shift of B−b−1 bits of the quantized value. The number of values of y' is 16, so y' can be represented with 4 bits, i.e. without extra bit. As shown on FIG. 3, the output values are still centred but there is no zero value in the output values. Because of the corrective term, values jump from −dq/2 to dq/2. In the presence of small values around zero, this produces a quantized "chequered flag" pattern (+dq/2,−dq/2,+dq/2,−dq/2,+dq/2, −dq/2, . . . ), which, most of the time, is not desired. FIG. 10 shows an example where a set of binary values x having all small values (−2, −1, 0, +1, +2), represented as a dashed line, results in dequantized values being either +8 or −8 (plain line).

Dead Zone (Method 2)

A known method, with a dead zone around zero (method 2) allows zero values, and solves the problem of method 1. A dead zone is introduced in the inverse quantization (See FIG. 4): all input values of x between −16 and +16 result in a dequantized value of zero. The number of values of y' is 15, so y' can be represented with 4 bits, i.e. without extra bit.

$$y'' = \left(y' + \frac{1}{2}\right) \cdot 2^{B-b} = (2y' + 1) \ll (B - b - 1)$$

$$x'' = \begin{cases} 0 & \text{if } y' = 0 \\ x_s y'' & \text{if } y' \neq 0 \end{cases}$$

Due to the nature of the rounding operation, the zero-centred bin is twice the width of the others in the case of signed values, resulting in a large flat area. As a consequence, the steps around the dead zone are half higher than the other steps. This has a negative impact on the quality of the signal at the output of a codec using this technique.

The two methods of binary value quantization discussed above can be implemented efficiently in software or in logic gates, yet they are suffering from different issues. Either the number of bits necessary to encode the truncated values may change depending on the truncation level, the zero could not be properly reconstructed by the inverse operation (method 1), or the inverse quantization introduces a dead zone around zero (method 2).

US20070160138 discloses a method for encoding and decoding video data, including film grain information, using a quantization method with a controllable dead zone. The size of the quantization step size for the smallest coefficient values is adjusted, and therefore, the quantization is non-uniform. The choice of the quantization step size in relation to the number of bits available for the quantized coefficients is not addressed.

Document "Near-lossless complexity-scalable embedded compression algorithm for cost reduction in DTV receivers, van der Schaar, M. et al., IEEE Transactions on Consumer Electronics archive Volume 46 Issue 4, November 2000 Page 923-93" discusses quantization methods. One quantization method involves quantization intervals that are limited to powers of 2 (see equation 5, page 928) and therefore have the disadvantages of the methods discussed above. Another quantization method (see equation 6, page 929) is more complex and designed for MPEG-2.

EP2819412 discloses a quantization method, where, for a set of binary input data values, a bias value is selected and only the offset from the bias value is output, as binary output values coded on less bits than the input data values.

Many encoding methods are known, which attempt to achieve a better compression. However, these methods imply an increased computational and storage requirement, which make them inapplicable to the high resolutions and high frame rates.

SUMMARY OF THE INVENTION

It is an object of the present invention to provide a method and device for compressing a set of input binary data values into a corresponding set of output data values coded in a smaller number of bits, not having the drawback of the methods discussed above, and a corresponding method and device for decompressing a set of input binary data values.

The invention is defined by the independent claims. The dependent claims define advantageous embodiments.

According to a first aspect of the invention, there is provided a method for compressing a set of input binary data values x, all coded in a same number B of bits, without counting the sign bit when the input binary data values comprise negative values, into a corresponding set of output data values x', all coded in a smaller number b of bits, without counting a sign bit, obtainable by the steps of:

a) If the set of input binary data values comprises negative values,
  for each input binary data value x, determining y, being the absolute value of x, and $x_s$, being the sign of x, coded in one bit;
b) If the set of input binary data values comprises no negative values,
  for each input binary data value x, determining y, being the value of x;
c) computing the quantization step size dq $$dq = \frac{2^{B+1}}{2^{b+1}-1}$$

d) dividing the range of values of y in $2^b$ subranges,
  the first subrange being [0, INT(dq/2)[
  the $i^{th}$ subrange being [INT((i−3/2)*dq)+1, INT((i−1/2)*dq)[, for i going from 2 to $2^b$
e) determining, for each value of y, the subrange i wherefrom it is an element and computing y'=i−1;
f) If the set of input binary data values comprises negative values,
  for each input binary data value x, determining x', being the value of y' together with $x_s$;
g) If the set of input binary data values comprises no negative values,
  for each input binary data value x, determining x', being the value of y'.

The range of values of y is the interval [0, $2^B$]. In one embodiment of the invention, the set of output data values x' are obtained by the above steps. In other embodiments of the invention, the set of output data values x' are obtained by the register-shift method or the look-up table method below. The subranges may also be named "bins", and the method the "bin method".

In an embodiment, the result of steps c), d) and e) may be obtained equivalently by performing the steps of
  right-shifting y by B−b bits giving first result;
  right-shifting y by B+1 bits giving second result;
  subtracting second result from first result giving third result;
  adding 0,5 giving fourth result;
  selecting the positive and zero-weight, i.e. non-fractional bits of fourth result, giving y'.

In the right shift operations, the fractional weight bits are kept. Both methods are equivalent. The value y' is coded in a number b of bits.

In another embodiment, the method comprises the steps of
  obtaining a lookup table containing, for each of the $2^B$ values of y, the corresponding value of y';
  determining for each value of y in said set, the corresponding value of y', at index y in said table.

According to a second aspect of the invention, there is provided a method for compressing input binary data comprising input binary data values into an output binary data, said output binary data having a volume smaller than a limit, the method comprising the steps of
  grouping said input binary data values in sets of $N_{GCLI}$ input binary data values;
  for each of said sets of $N_{GCLI}$ input binary data values:
    determine the GCLI, being the index of the highest non-zero bit in said set, without counting a sign bit
  selecting a value of GTLI such that counting GCLI−GTLI bits for all said input binary data values produces output binary data having a volume smaller than said limit;
  for each of said sets of $N_{GCLI}$ input binary data values:
    applying the method of any of claims 1 to 3, with B=GCLI and b=MAX(GCLI−GTLI,0)
  producing output binary data comprising the GTLI and, for each of said sets of $N_{GCLI}$ input binary data value, the value of the GCLI and the $N_{GCLI}$ quantized values x'.

In the trivial case where b=0, which may occur in execution of the method of the second aspect of the invention, then the output data values have a value zero and are coded on zero bits. In that case the output binary data for the set only contain the GCLI.

This method is applied advantageously where said input binary data is resulting from a decorrelative transform of video data.

$N_{GCLI}$ may be comprised between 4 and 16, and preferably equal to 4.

According to a third aspect of the invention, there is provided a method for decompressing a set of input binary data values x', all coded in a same number b of bits, without counting a possible sign bit, into a corresponding set of output data values x", all coded in a larger number B of bits, without counting a possible sign bit, comprising the steps of:
a) computing $$dq = \frac{2^{B+1}}{2^{b+1}-1}$$

b) if the set of input binary data values comprises negative values, for each input binary data value x', determining y', being the absolute value of x', and $x'_s$, being the sign of x', coded in one bit;
c) If the set of input binary data values comprises no negative values, for each input binary data value x', determining y', being the value of x';
d) computing for each y'

$$y''=\lfloor y'\cdot dq \rfloor$$

e) If the set of input binary data values comprises negative values, for each input binary data value y', determining x", being the value of y" together with x's;
f) If the set of input binary data values comprises no negative values, for each input binary data value x', determining x", being the value of y".

In the decompression method said step d) may comprise the steps of
  i. left-shifting y' by B−b bits giving first result;
  ii. right-shifting first result by b+1 bits giving second result;
  iii. adding second result to first result giving sum result;
  iv. copying second result to first result;
  v. repeating steps ii.-iv. until second result is lower than zero;
  vi. computing y" as the integer part of sum result.

In the decompression method said step d) may also comprise the steps of
  i. left-shifting y' by B−b bits giving first result;
  ii. right-shifting first result by b+1 bits giving second result;
  iii. adding second result to first result giving sum result;
  iv. computing y" as the integer part of sum result.

The decompression method may comprise the steps of
obtaining a lookup table containing, for each of the $2^b$ values of y', the corresponding value of y";
determining for each value of y' in said set, the corresponding value of y", at index y' in said table.

According to a fourth aspect of the invention, there is provided a method for decompressing input binary data comprising sets of $N_{GCLI}$ input binary data value, each set comprising the value of B, B being the number of bit of decompressed binary data values, the value of b, b being the number of bits of said input binary data values, without counting a possible sign bit, the method comprising the steps of
applying the method of any of claims 7 to 10, for obtaining decompressed binary data values;
producing output binary data comprising said decompressed binary data values.

Said decompressed binary data values may be completed with a number of '0' bits for obtaining words having a given length.

The invention also relates to the use of a decompression method according the invention for decompressing a set of input binary data values x' obtainable by the compression method of the invention.

The invention also relates to a device for compressing a set of input binary data values x, all coded in a same number of bits, into a corresponding set of output data values x', all coded in a smaller number of bits, comprising program code for executing the compression method of the invention.

The invention also relates to a device for compressing a set of input binary data values x, all coded in a same number of bits, into a corresponding set of output data values x', all coded in a smaller number of bits, comprising hardware for executing the compression method the invention.

The invention also relates to a device for decompressing a set of input binary data values x', all coded in a same number of bits, into a corresponding set of output data values x", all coded in a larger number of bits, comprising program code for executing the decompression method the invention.

The invention also relates to a device for decompressing a set of input binary data values x', all coded in a same number of bits, into a corresponding set of output data values x", all coded in a larger number of bits, comprising hardware for executing the decompression method of the invention.

The methods of the invention apply to sets of input binary data values having all positive integer values and to input binary data values having positive and negative values. In the latter case, it is assumed that the negative values are represented by a sign bit and a magnitude (absolute value). If another representation is used, e.g. ones'-complement or two's-complement, it is a straightforward operation known to the man skilled in the art to translate the input binary data values to their sign-magnitude representation.

SHORT DESCRIPTION OF THE DRAWINGS

These and further aspects of the invention will be explained in greater detail by way of example and with reference to the accompanying drawings in which:
FIG. 1 represents reconstructed values x" in plain lines and original values x in dashed lines, in function of original values x, for a known quantization method applicable to natural values. Nmax=128, dq=16;

The drawings of the figures are neither drawn to scale nor proportioned. Generally, identical components are denoted by the same reference numerals in the figures.

DETAILED DESCRIPTION OF EMBODIMENTS OF THE INVENTION

A first component of the invention is a quantization algorithm which offers an advantage in the scope of image compression, requires no extra bit and provides a solution to the problems mentioned in relation to method 1 and method 2 above. The quantization algorithm will be referred to as "GRQ".

Figure 5:
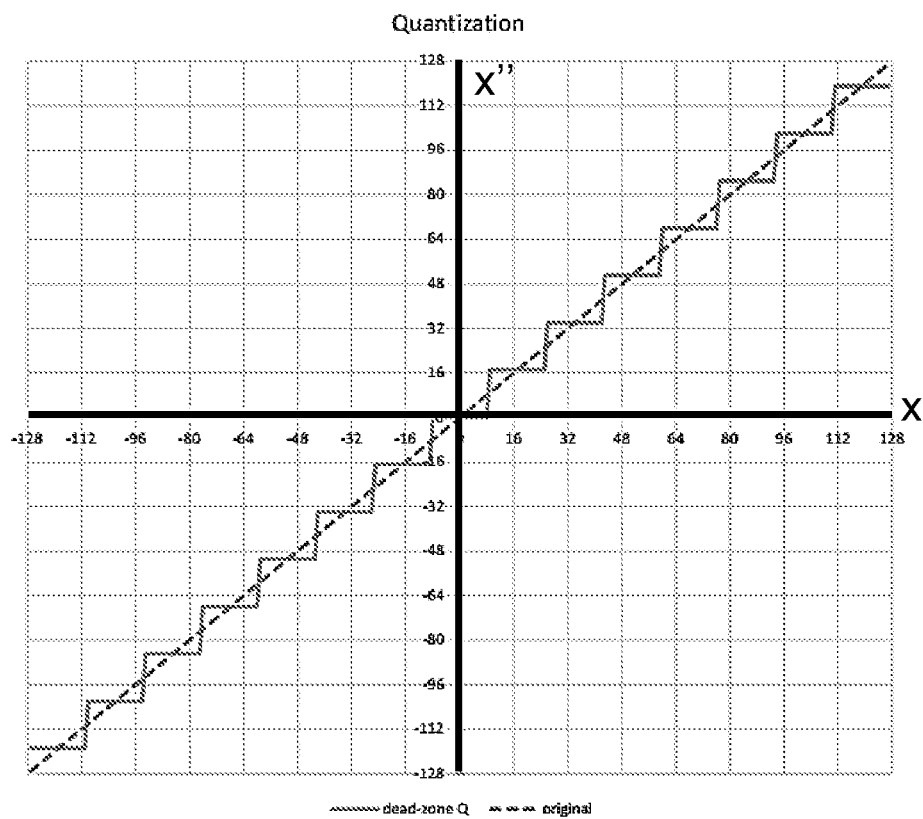
FIG. 5 represents reconstructed values x" in plain lines and original values x in dashed lines, in function of original values x, for a method for compressing according to the invention.

FIG. 5 shows an example of the application of a quantization algorithm for a compression method according to the invention where the input binary data values comprise data values between −127 and +127. The number of bits used for coding the absolute values of x is 7 bits, i.e. B=7. The number of absolute quantized values is 8, i.e. the quantized values can be coded on 3 bits, and b=3.

Figure 1:
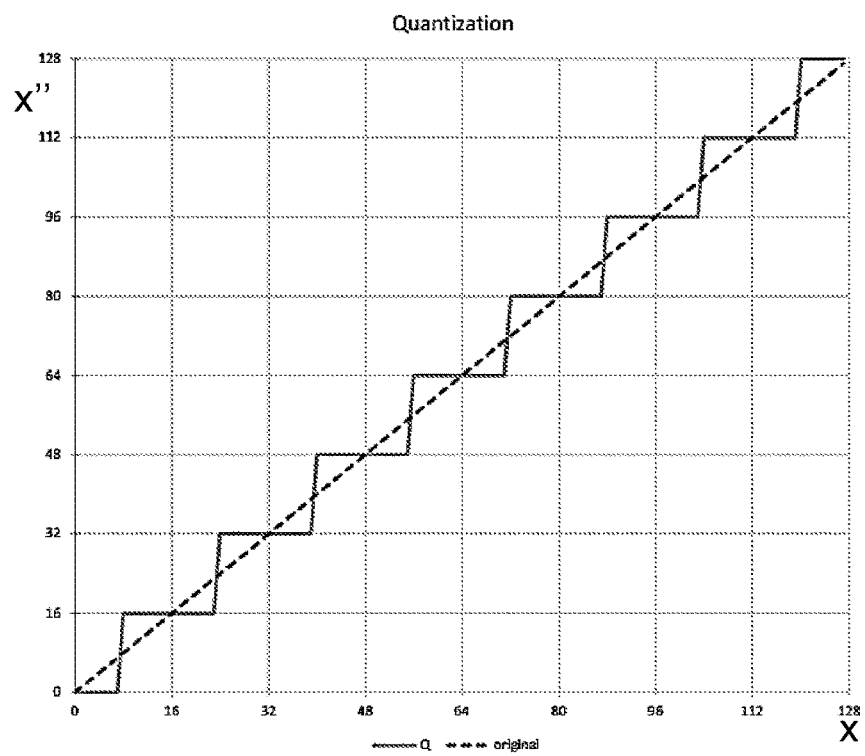
Figure 2:
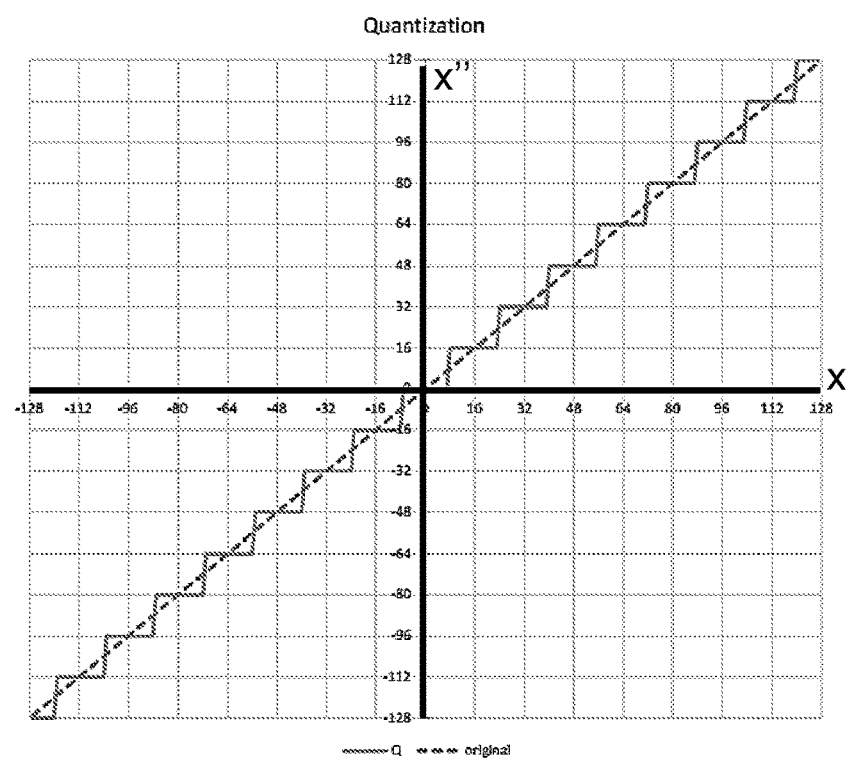
FIG. 2 represents reconstructed values x" in plain lines and original values x in dashed lines, in function of original values x, for a known quantization method applicable to signed values.
Figure 3:
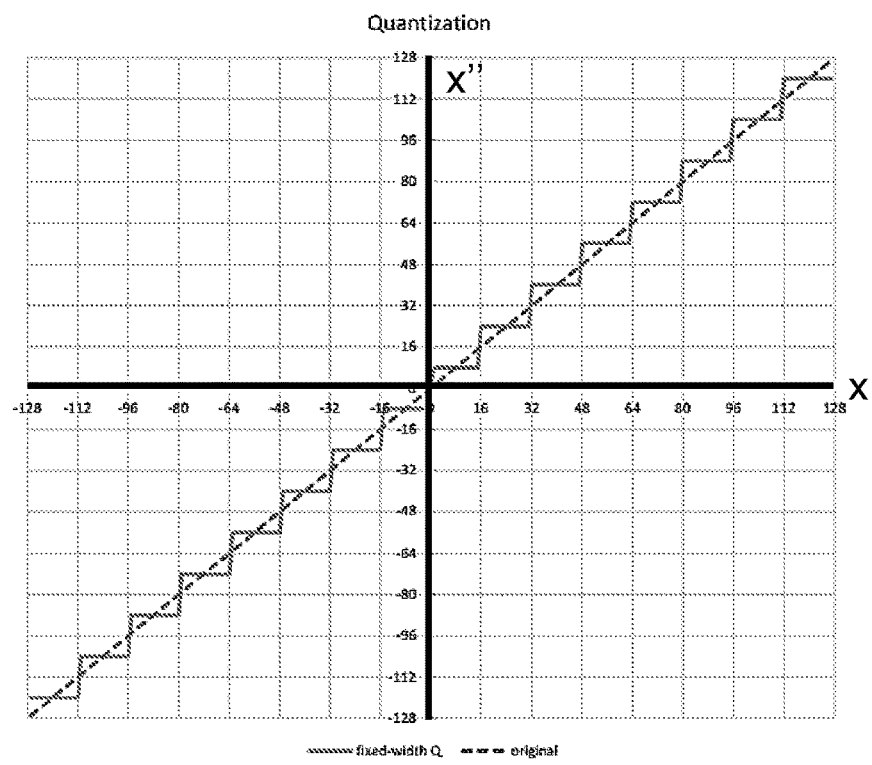
FIG. 3 represents reconstructed values x" in plain lines and original values x in dashed lines, in function of original values x, for a known quantization method applicable to binary signed values, with fixed-width quantization (method 1)
Figure 4:
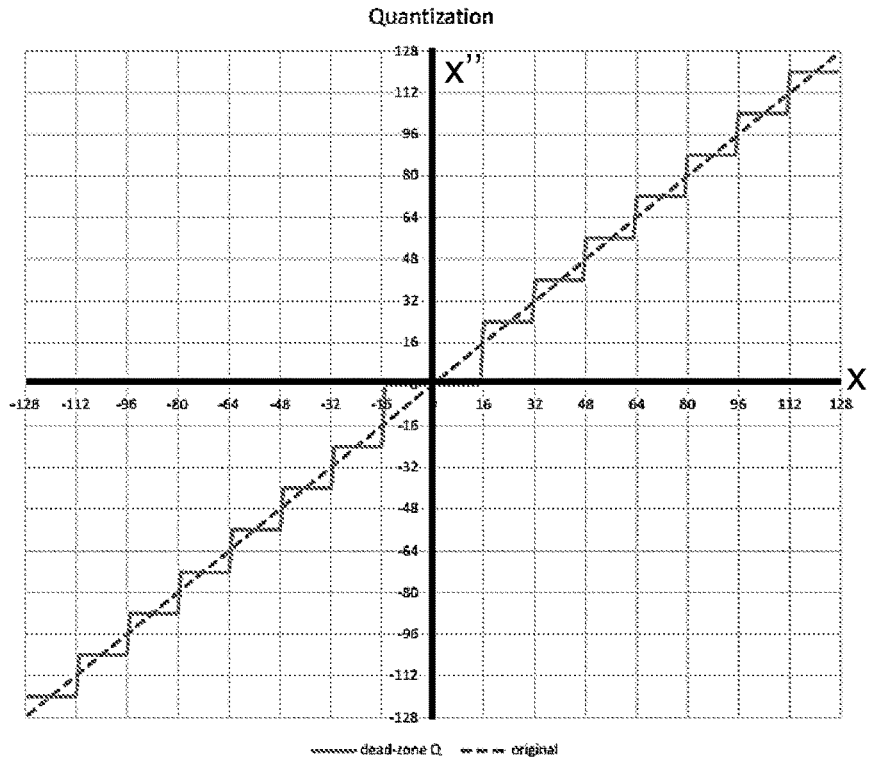
FIG. 4 represents reconstructed values x" in plain lines and original values x in dashed lines, in function of original values x, for a known quantization method applicable to binary signed values, with dead zone (method 2)

According to the invention, the range of values is divided in $2^{b+1}-1$ subranges (in the example of FIG. 5, 15 subranges), instead of $2^{b+1}$ subranges (in the example of FIG. 3, 16 subranges). The quantization step size dq is:

$$dq = \frac{2^{B+1}}{2^{b+1}-1} = \frac{1}{2^{b-B}-2^{-B-1}} = 17.06666$$

The quantization step size is slightly larger than in the prior art (the examples of FIGS. 1, 2, 3 and 4 all have a quantization step size of 16).

The table below shows the resulting subranges, for positive values of x (i.e. the upper right quarter of FIG. 5)

| Subrange i | first value of x | Last value of x | nb of values |
|---|---|---|---|
| 1 | 0 | 8 | 9 |
| 2 | 9 | 25 | 17 |
| 3 | 26 | 42 | 17 |
| 4 | 43 | 59 | 17 |
| 5 | 60 | 76 | 17 |
| 6 | 77 | 93 | 17 |
| 7 | 94 | 110 | 17 |
| 8 | 111 | 127 | 17 |
| | | | 128 |

Quantized values are obtained from the subrange i by subtracting 1.

The quantization algorithm always produces the exact number b of bits in the quantized values, and thus is appropriate in compression schemes featuring a rate allocation since it guarantees a predictable rate in function of the quantization level, with a better quality. This makes it the ideal quantization algorithm to be used in conjunction with the second component of this invention, the GCLI values (Greatest Coded Line Index), which allow an efficient rate allocation method.

As an alternative to the "bin method", the same quantized values may also be obtained by the following formula:

$$y' = \frac{y}{dq} + \frac{1}{2} = 2^{b-B} \cdot |x| - 2^{-B-1} \cdot |x| + \frac{1}{2} = |x| \gg (B-b) - |x| \gg (B+1) + \frac{1}{2}$$

As can be seen from the right-hand part of this equation, the operation may be achieved with two additions and two binary shifts, the latter being free in logic gates.

Figure 6:
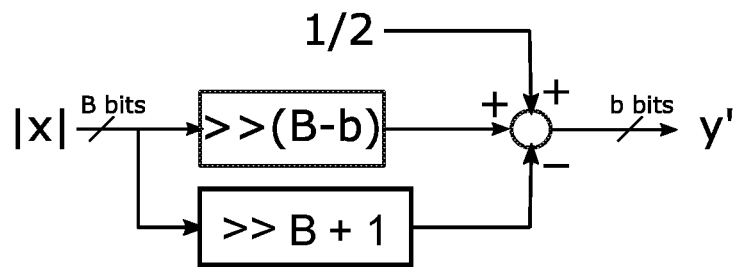
FIG. 6 represents schematically a device for quantization for a method for compressing according to an embodiment of the invention.

A hardware configuration for performing these operations is show on FIG. 6. Shift operations are easy to implement with logic gates. In the shift operations, the fractional bits must be kept. As an alternative to the register-shift method, the compression may be performed with a lookup table. The lookup table method is most convenient when B is not too large. The lookup table may be obtained by applying the method to all integers between 0 and $2^B-1$.

The inverse quantization values are obtained by equation $$y'' = y' \cdot dq = y' \cdot \frac{2^{B+1}}{2^{b+1} - 1} \quad (2)$$

We know from the geometrical series that $$\frac{1}{2^{b+1} - 1} = \frac{2^{b+1}}{2^{b+1} - 1} - 1 = \frac{1}{1 - 2^{-b-1}} - 1 = \sum_{i=0}^{\infty} (2^{-b-1})^i - 1 = \sum_{i=1}^{\infty} 2^{-(b+1)\cdot i}$$

Figure 7:
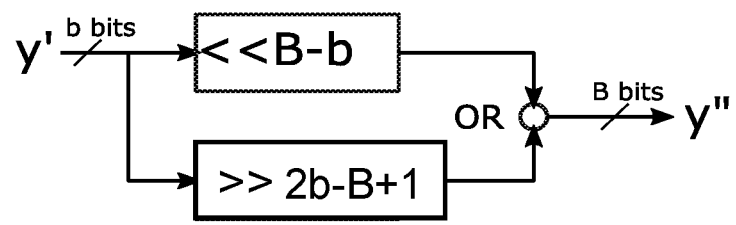
FIG. 7 represents schematically a device for dequantization for a method for decompressing according to an embodiment of the invention.

Interestingly, y' is coded on b bits, which allows to simplify expression (2) to $$y' \cdot \frac{2^{B+1}}{2^{b+1} - 1} = 2^{B+1} \cdot y' \cdot \sum_{i=1}^{\infty} 2^{-(b+1)\cdot i} = \bigvee_{i=1}^{\infty} y' \gg (i \cdot (b+1) - B - 1)$$

where the "V" operator stands for "binary or". Actually, since the binary or is applied between b-bit values shifted of i.b positions, this operation can be simplified to concatenating the bits of the successive values. In practical cases, the value of B will not be many times higher than b. If B>b and B<2b+1, it is only necessary to concatenate the bits of y'<<(B−b) and y'>>(2b−B+1), as shown in FIG. 7.

In summary, the operation has the same complexity level than what is done in the state of the art:
  the quantization is subtracting two shifted values of |x| then adding a bit after the LSB
  the inverse quantization is a concatenation of shifted values of y'

The quality of the reconstructed values is higher given the same level of quantization, which means the invention provides an increased quality at the same bitrate in the transmission for a compression algorithm.

A set of typical test images have been compressed according to the method 2 (having a dead zone, "DZ") and the invention. The signal to noise ratio PSNR between the compressed image and original image is compared for sixteen test images. The table below shows that the method of the invention has an improvement for all images of the test set.

| filename | PSNR DZ | PSNR invention | improv |
|---|---|---|---|
| Image_001.png | 32.95 | 34.45 | 1.50 |
| Image_002.png | 42.60 | 44.03 | 1.43 |
| Image_003.png | 42.57 | 43.95 | 1.38 |
| Image_004.png | 37.31 | 38.49 | 1.18 |
| Image_005.png | 38.23 | 39.41 | 1.18 |
| Image_006.png | 35.01 | 36.18 | 1.17 |
| Image_007.png | 41.37 | 42.49 | 1.12 |
| Image_008.png | 40.46 | 41.57 | 1.11 |
| Image_009.png | 41.08 | 42.15 | 1.07 |
| Image_010.png | 33.11 | 34.00 | 0.89 |
| Image_011.png | 39.27 | 40.16 | 0.89 |
| Image_012.png | 29.90 | 30.76 | 0.86 |
| Image_013.png | 36.68 | 37.54 | 0.86 |
| Image_014.png | 36.16 | 36.99 | 0.83 |
| Image_015.png | 31.38 | 32.20 | 0.82 |
| Image_016.png | 34.11 | 34.92 | 0.81 |

A second component of the invention is related to the compression of input binary data such as video streams. Methods of data compression on values that are correlated, typically image compression, include the two following characteristics:
  data are quantized to reduce the amount of bits to store or transmit to the decoder;
  information on how the data have been quantized (B−b) is inserted in front of the quantized data, since it will be required by the decoder to apply the inverse quantization. The resulting information is called a codestream.

Since the data offer some level of correlation, for example coefficients produced by a DWT (Discrete Wavelet Transform), there is an advantage in regrouping them and applying common quantization level on vectors or blocks, thus reducing the amount of information the decoder will require to reconstruct the data. Most of the time, the bandwidth of the transmitted codestream is restricted by the communication channel bitrate, or similarly, the size of the compressed file is restricted by the capacity of the storage media. Since higher compression rates yield lower quality of the reconstructed data, it is important for the compression algorithm to be able to produce a codestream which is as close as possible of the optimal bitrate and use all the available bandwidth to maximize the quality. This is the purpose of the rate allocation, which has to determine the quantization level applied to the data such that the quality is maximum for the given bitrate.

The choice of the data structure processed by the rate allocation is of paramount importance, it has to fulfil these requirements:
- be concise: usually the compression must be achieved as quickly as possible, and the higher the amount of data processed by the rate allocation, the slower it will take;
- be representative of the quality: the rate allocation optimizes the quality for a given bitrate, it must be able to estimate the quality loss in function of the quantization level;
- be efficiently transcodable into the codestream: the decoder needs enough information to reconstruct the data (e.g. apply the correct inverse quantization on each block).

Figure 8:
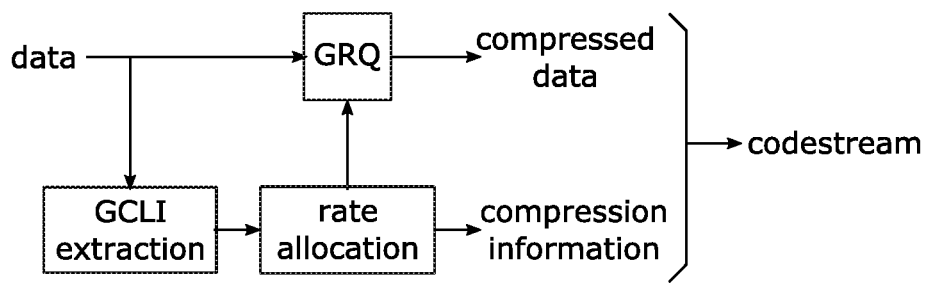
FIG. 8 represents schematically a method according to a preferred embodiment of the invention.
Figures 9, 10:
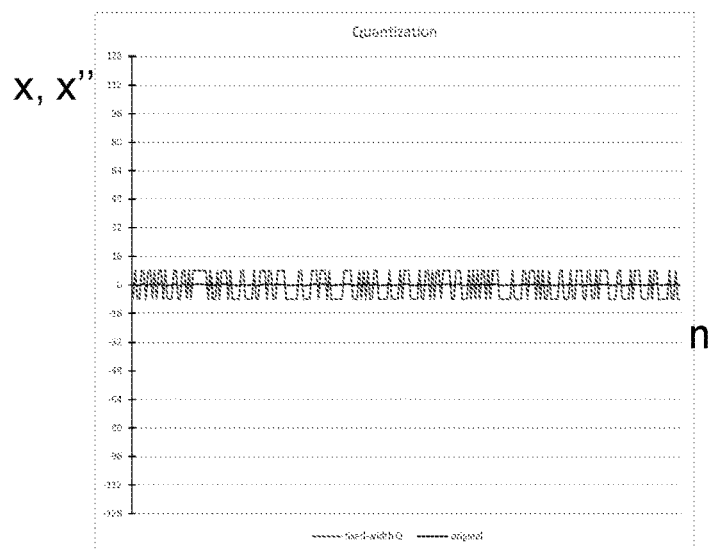
FIG. 9 represents exemplary data set where the method of the invention is applied.
FIG. 10 illustrates a problem with fixed width quantization (method 1), as discussed above.

The GCLI value of a vector or block of $N_{GCLI}$ data is the maximum number of bits necessary to code the magnitude of its values in binary representation. So −6 is coded b110 (plus one sign bit), and requires 3 bits to encode its absolute value. A block with the values (4,9,2,5) has a GCLI=4, since the maximum is 9 and is coded b1001. Zero requires zero bit to encode, and does not need a sign. Further examples are shown in FIG. 9. Input binary data, comprising 16 binary data values all coded in 15 bits plus sign bits are represented. As may occur in decorrelated data, many data values are small and most of the most significant bits are at zero (represented as grey area). The input data are grouped in sets of four ($N_{GCLI}$=4) words. For each of these sets, the value of GCLI is determined. For the whole set of input data, a value of GTLI (here GTLI=4) is selected so that the size of the data resulting from the compression (a different value of b for each set) will meet the limitation of the available bandwidth of storage size. For each of the sets, the quantization method is applied, and the resulting data are put in the output binary data, together with the values of GCLI. The GTLI, having the same value for all sets of the data, is transmitted or stored only once. The GCLI values are used to summarize the data in the rate allocation, since they adequately fulfil the requirements mentioned before. To illustrate the reasoning, a possible architecture is shown in FIG. 8, where:
- the correlated data is grouped in blocks of $N_{GCLI}$ values, from which are extracted the GCLI's;
- the GCLI values are used by the rate allocation to determine the quantization levels;
- the quantization is applied to the data (GRQ);
- the codestream is created from the compressed data and the information required to decompress it—in this example, the quantization levels and the GCLI's.

The GCLI's are concise, one value represents the maximum logarithm in a block containing multiple values, so it will not require many bits to encode: typically, 16 bits are enough to code coefficients in a DWT, which means that 4-bit GCLI values can be used. If $N_{GCLI}$=4, one 4-bit GCLI represents 4 coefficients of 16 bits in the rate allocation, which is a ratio of 1 to 64. This is efficient since neighbor values are correlated and will have similar magnitudes, so using the same number of bits to code them all is near-optimal. This means the GCLI's provide the rate allocation with concise information to compute the output rate in function of the truncation level. Furthermore, the GCLI values actually provide local quantization step sizes dq, as illustrated in FIG. 9. The truncated part or GTLI (Greatest Trimmed Level Index) is set individually for each subband like other algorithms, but the maximum number of bits B is set by each GCLI, so for each group of $N_{GCLI}$ data. This last property reduces the number of bits to encode by removing the upper zero MSB's in large blocks, which more than compensate the cost of inserting GCLI information in the output stream (necessary for the inverse quantization).

Using the GCLI method requires a predictable rate in function of the quantization. The GRQ quantization preserves the zero values and ensures that the number of bits to encode the quantized values remains b, thus allowing an easy control of the output rate in function of the quantization through the parameter GTLI (for each subband) in the rate allocation process. As shown before, it does not suffer from a larger dead zone like other quantization schemes that preserve the number of bits and the zero values, and thus has a lower average error in the decoding.

The method of the invention achieves compression of a set of coefficients in a few steps, in an extremely simple and effective way for hardware implementation. As this compression scheme encodes several pixels at the same time, parallel encoding of multiple pixels is intrinsic to the proposed codec. It allows reaching high pixel rate with a low complexity codec, while keeping good compression efficiency.

The present invention has been described in terms of specific embodiments, which are illustrative of the invention and not to be construed as limiting. More generally, it will be appreciated by persons skilled in the art that the present invention is not limited by what has been particularly shown and/or described hereinabove.

Reference numerals in the claims do not limit their protective scope. Use of the verbs "to comprise", "to include", "to be composed of", or any other variant, as well as their respective conjugations, does not exclude the presence of elements other than those stated. Use of the article "a", "an" or "the" preceding an element does not exclude the presence of a plurality of such elements.

The invention may also be described as follows: the invention provides a method and device for compressing a set of input binary data values x, all coded in a same number B of bits, without counting the sign bit when the input binary data values comprise negative values, into a corresponding set of output data values x', all coded in a smaller number b of bits, without counting a sign bit, obtainable by the steps of:
a) If the set of input binary data values comprises negative values,
   for each input binary data value x, determining y, being the absolute value of x, and xs, being the sign of x, coded in one bit;
b) If the set of input binary data values comprises no negative values,
   for each input binary data value x, determining y, being the value of x;
c) computing the quantization step size dq $$dq = \frac{2^{B+1}}{2^{b+1} - 1}$$

d) dividing the range of values of y, [0, 2B−1[, into 2b subranges,
   the first subrange being [0, INT(dq/2)[
   the ith subrange being [INT((i−3/2)*dq)+1, INT((i−1/2)*dq)[,
   for i going from 2 to 2b
e) determining, for each value of y, the subrange i wherefrom it is an element and computing y'=i−1;
f) If the set of input binary data values comprises negative values, for each input binary data value x, determining x', being the value of y' together with xs;

g) If the set of input binary data values comprises no negative values,
for each input binary data value x, determining x', being the value of y'.

The invention claimed is:

1. Method for compressing a set of input binary data values x, all coded in a same number B of bits, without counting the sign bit when the input binary data values comprise negative values, comprising the step of determining a corresponding set of compressed output data values x', all coded in a smaller number b of bits, without counting a sign bit, wherein the set of compressed output data values x' is obtainable by the steps of:
a) for each input binary data value x, determining y as follows:
  (i) If the set of input binary data values comprises negative values, determining y, being the absolute value of x, and $x_s$, being the sign of x, coded in one bit;
  (ii) If the set of input binary data values comprises no negative values, determining y, being the value of x;
b) computing the quantization step size dq $$dq = \frac{2^{B+1}}{2^{b+1}-1}$$

c) dividing the range of values of y, [0, $2^B$-1[, into $2^b$ subranges,
the first subrange being [0, INT(dq/2)[
the $i^{th}$ subrange being [INT((i-3/2)*dq)+1, INT((i-1/2)*dq)[, for i going from 2 to $2^b$
d) determining, for each value of y, the subrange i wherefrom it is an element and computing y'=i-1;
e) If the set of input binary data values comprises negative values,
for each input binary data value x, determining x', being the value of y' together with $x_s$;
f) If the set of input binary data values comprises no negative values,
for each input binary data value x, determining x', being the value of y'.

2. Method according to claim 1, wherein the steps b) to d) are implemented by performing the steps of
right-shifting y by B-b bits giving first result;
right-shifting y by B+1 bits giving second result;
subtracting second result from first result giving third result;
adding 0.5 to third result giving fourth result;
select the positive- and zero-weight bits of fourth result, giving y'.

3. Method according to claim 1, comprising the steps of
obtaining a lookup table containing, for each of the $2^B$ values of y, the corresponding value of y';
determining for each value of y in said set, the corresponding value of y', at index y in said table.

4. Method for compressing input binary data comprising input binary data values into an output binary data, said output binary data having a volume smaller than a limit, the method comprising the steps of
grouping said input binary data values in sets of $N_{GCLI}$ input binary data values;

for each of said sets of $N_{GCLI}$ input binary data values:
Determine the GCLI, being the index of the highest non-zero bit in said set, without counting a sign bit
selecting a value of GTLI such that counting GCLI-GTLI bits for all said input binary data values produces output binary data having a volume smaller than said limit;
for each of said sets of $N_{GCLI}$ input binary data values:
applying the method of claim 1, with B=GCLI and b=MAX(GCLI-GTLI,0)
producing output binary data comprising the GTLI and for each of said sets of $N_{GCLI}$ input binary data value, the value of the GCLI and the $N_{GCLI}$ quantized values x'.

5. Method according to claim 4 where said input binary data is resulting from a decorrelative transform of video data.

6. Method according to claim 4 where $N_{GCLI}$ is comprised between 4 and 16.

7. Method for decompressing a set of input binary data values x', all coded in a same number b of bits, without counting a possible sign bit, into a corresponding set of output data values x", all coded in a larger number B of bits, without counting a possible sign bit, comprising the steps of:
a) computing $$dq = \frac{2^{B+1}}{2^{b+1}-1}$$

b) If the set of input binary data values comprises negative values, for each input binary data value x', determining y', being the absolute value of x', and $x'_s$, being the sign of x', coded in one bit;
c) If the set of input binary data values comprises no negative values, for each input binary data value x', determining y', being the value of x';
d) computing for each y'

$$y''=\lfloor y' \cdot dq \rfloor$$

e) If the set of input binary data values comprises negative values, for each input binary data value y', determining x", being the value of y" together with $x'_s$;
f) If the set of input binary data values comprises no negative values, for each input binary data value x', determining x", being the value of y".

8. Method according to claim 7, wherein said step d) comprises the steps of
i. left-shifting y' by B-b bits giving first result;
ii. right-shifting first result by b+1 bits giving second result;
iii. adding second result to first result giving sum result;
iv. copying contents of second result into first result;
v. repeating steps ii.-iv. until second result is lower than zero;
vi. computing y" as the integer part of sum result.

9. Method according to claim 7, wherein b≤B/2 and said step d) comprises the steps of
i. left-shifting y' by B-b bits giving first result;
ii. right-shifting first result by b+1 bits giving second result;
iii. adding second result to first result giving sum result;
iv. computing y" as the integer part of sum result.

10. Method according to claim 7, comprising the steps of obtaining a lookup table containing, for each of the $2^b$ values of y', the corresponding value of y";

determining for each value of y' in said set, the corresponding value of y", at index y' in said table.

11. Method for decompressing input binary data comprising sets of $N_{GCLI}$ input binary data value, each set comprising the value of B, B being the number of bit of decompressed binary data values, the value of b, b being the number of bits of said input binary data values, without counting a possible sign bit, the method comprising the steps of applying the method of claim 7, for obtaining decompressed binary data values;

producing output binary data comprising said decompressed binary data values.

12. Method for decompressing according to claim 11 where said decompressed binary data values are completed with a number of '0' bits for obtaining words having a given length.

13. Apparatus for compressing a set of input binary data values x, all coded in a same number of bits, into a corresponding set of output data values x', all coded in a smaller number of bits, comprising an input terminal for receiving said set of input binary data values x, the apparatus storing program code that when executed causes the apparatus to perform the method of claim 1, and an output terminal for outputting said set of output data values x', the program code causing the apparatus to compress the set of input binary values x into the set of output data values x'.

14. Apparatus comprising hardware for executing the method of claim 2 adapted for compressing a set of input binary data values x, all coded in a same number of bits, into a corresponding set of output data values x', all coded in a smaller number of bits.

15. Apparatus for decompressing a set of input binary data values x', all coded in a same number of bits, into a corresponding set of output data values x", all coded in a larger number of bits, comprising an input terminal for receiving said set of input binary data values x', the apparatus storing program code that when executed causes the apparatus to perform the method of claim 7 and an output terminal for outputting said set of output data values x", the program code causing the apparatus to decompress the set of input binary data values x' into the set of output data values x".

16. Apparatus comprising hardware for executing the method of claim 7 adapted for decompressing a set of input binary data values x', all coded in a same number of bits, into a corresponding set of output data values x", all coded in a larger number of bits.

* * * * *